US010953319B2

(12) United States Patent
Guo

(10) Patent No.: US 10,953,319 B2
(45) Date of Patent: Mar. 23, 2021

(54) SPIN TRANSFER MRAM ELEMENT HAVING A VOLTAGE BIAS CONTROL

(71) Applicant: Yimin Guo, San Jose, CA (US)

(72) Inventor: Yimin Guo, San Jose, CA (US)

(*) Notice: Subject to any disclaimer, the term of this patent is extended or adjusted under 35 U.S.C. 154(b) by 0 days.

(21) Appl. No.: 14/153,047

(22) Filed: Jan. 12, 2014

(65) Prior Publication Data

US 2014/0210025 A1   Jul. 31, 2014

Related U.S. Application Data

(60) Provisional application No. 61/751,897, filed on Jan. 28, 2013.

(51) Int. Cl.
| | |
|---|---|
| *H01L 27/22* | (2006.01) |
| *G11C 11/16* | (2006.01) |
| *H01L 29/82* | (2006.01) |
| *H01F 10/32* | (2006.01) |
| *H01L 43/00* | (2006.01) |
| *G11C 11/00* | (2006.01) |
| *H01L 43/08* | (2006.01) |
| *A63F 13/218* | (2014.01) |
| *G07F 17/32* | (2006.01) |

(Continued)

(52) U.S. Cl.
CPC ............ *A63F 13/218* (2014.09); *A63F 13/10* (2013.01); *G06F 3/017* (2013.01); *G07F 17/3204* (2013.01); *G07F 17/3293* (2013.01); *G11C 11/16* (2013.01); *G11C 11/161* (2013.01); *G11C 11/1659* (2013.01); *G11C 11/1673* (2013.01); *G11C 11/1675* (2013.01); *H01L 27/22* (2013.01); *H01L 27/222* (2013.01); *H01L 27/226* (2013.01); *H01L 27/228* (2013.01); *H01L 29/82* (2013.01); *H01L 43/08* (2013.01); *G11C 11/00* (2013.01); *G11C 11/165* (2013.01); *G11C 11/1653* (2013.01); *G11C 11/1655* (2013.01); *G11C 11/1657* (2013.01); *H01F 10/3204* (2013.01); *H01F 10/3209* (2013.01); *H01L 43/00* (2013.01); *H01L 43/10* (2013.01)

(58) Field of Classification Search
CPC ..... H01L 27/22; H01L 27/222; H01L 27/226; H01L 27/228; H01L 29/82; H01L 43/08; H01L 43/10; H01L 43/00; H01F 10/3204; H01F 10/3209; G11C 11/00; G11C 11/16; G11C 11/161; G11C 11/165; G11C 11/1653; G11C 11/1655; G11C 11/1657; G11C 11/1659
USPC .................................. 257/E29.323, E21.665
See application file for complete search history.

(56) References Cited

U.S. PATENT DOCUMENTS

| | | | | |
|---|---|---|---|---|
| 7,009,877 B1 * | 3/2006 | Huai et al. | ..................... | 365/171 |
| 2003/0179510 A1 * | 9/2003 | Hayakawa | ................. | 360/324.1 |

(Continued)

*Primary Examiner* — Eduardo A Rodela
*Assistant Examiner* — Christopher M Roland

(57) ABSTRACT

A STT-MRAM comprises apparatus, a method of operating a spin-torque magnetoresistive memory and a plurality of magnetoresistive memory element having a bias voltage controlled perpendicular anisotropy of a recording layer through an interlayer interaction to achieve a lower spin-transfer switching current. The anisotropy modification layer is under an electric field along a perpendicular direction with a proper voltage between a digital line and a bit line from a control circuitry, accordingly, the energy switch barrier is reduced in the spin-transfer recording while maintaining a high thermal stability and a good retention.

15 Claims, 8 Drawing Sheets

(51) Int. Cl.
*G06F 3/01* (2006.01)
*A63F 13/40* (2014.01)
*H01L 43/10* (2006.01)

(56) References Cited

U.S. PATENT DOCUMENTS

| | | | |
|---|---|---|---|
| 2005/0207216 A1* | 9/2005 | Fukuzumi | H01L 27/228 |
| | | | 365/158 |
| 2007/0045759 A1* | 3/2007 | Chung | H01L 27/228 |
| | | | 257/421 |
| 2007/0164381 A1* | 7/2007 | Ho et al. | 257/421 |
| 2008/0088980 A1* | 4/2008 | Kitagawa et al. | 360/313 |
| 2009/0052237 A1* | 2/2009 | Morise | G11C 11/1659 |
| | | | 365/171 |
| 2009/0141541 A1* | 6/2009 | Covington | 365/158 |
| 2009/0161422 A1* | 6/2009 | Zhu | G11C 11/1659 |
| | | | 365/171 |
| 2010/0034014 A1* | 2/2010 | Ohno et al. | 365/158 |
| 2010/0073984 A1* | 3/2010 | Xi | G11C 19/0841 |
| | | | 365/80 |
| 2010/0188893 A1* | 7/2010 | Zhou | G11C 11/1673 |
| | | | 365/171 |
| 2012/0214021 A1* | 8/2012 | Sayama et al. | 428/836.1 |
| 2014/0203341 A1* | 7/2014 | Guo | 257/295 |
| 2014/0246741 A1* | 9/2014 | Guo | H01L 43/08 |
| | | | 257/421 |
| 2014/0254252 A1* | 9/2014 | Guo | 365/158 |
| 2020/0321393 A1* | 10/2020 | Manipatruni | H01L 43/12 |

* cited by examiner

SPIN TRANSFER MRAM ELEMENT HAVING A VOLTAGE BIAS CONTROL

RELATED APPLICATIONS

This application claims the priority benefit of U.S. Provisional Application No. 61/751,897, filed on Jan. 13, 2013, which is incorporated herein by reference.

BACKGROUND OF THE INVENTION

1. Field of the Invention

This invention relates generally to a spin-transfer-torque magnetic-random-access memory (MRAM) element and a method of manufacturing the same magnetoresistive element, more particularly to structures and methods of reading and programming a spin-torque magnetoresistive random access memory (MRAM) element having a voltage bias controlled writing.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both magnetization films have easy axis of magnetization in a direction perpendicular to the film plane due to their strong magnetic crystalline anisotropy, shape anisotropies are not used, and accordingly, the device shape can be made smaller than that of an in-plane magnetization type. Also, variance in the easy axis of magnetization can be made smaller. Accordingly, by using a material having a large magnetic crystalline anisotropy, both miniaturization and lower currents can be expected to be achieved while a thermal disturbance resistance is maintained.

There has been a known technique for achieving a high MR ratio in a perpendicular magnetoresistive element by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved. However, where a MTJ is formed as a device of a perpendicular magnetization type, the materials of the recording layer typically used in an in-plane MTJ for both high MR and low damping constant as required by low write current application normally don't have enough magnetic crystalline anisotropy to achieve thermally stable perpendicular magnetization against its demagnetization field. In order to obtain perpendicular magnetization with enough thermal stability, the recording layer has to be ferromagnetic coupled to additional perpendicular magnetization layer, such as TbCoFe, or CoPt, or multilayer such as (Co/Pt)n, to obtain enough perpendicular anisotropy. Doing so, reduction in write current becomes difficult due to the fact that damping constant increases from the additional perpendicular magnetization layer and its associated seed layer for crystal matching and material diffusion during the heat treatment in the device manufacturing process.

In a spin-injection MRAM using a perpendicular magnetization film, a write current is proportional to the perpendicular anisotropy, the damping constant and inversely proportional to a spin polarization, and increases in proportional to a square of an area size. Therefore, reduction of the damping constant, increase of the spin polarization and reduction of an area size are mandatory technologies to reduce the write current.

Besides a write current, the stability of the magnetic orientation in a MRAM cell as another critical parameter has to be kept high enough for a good data retention, and is typically characterized by the so-called thermal factor which is proportional to the perpendicular anisotropy as well as the volume of the recording layer cell size. Although a high perpendicular anisotropy is preferred in term of a high thermal disturbance resistance, an increased write current is expected as a cost.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, STT-MRAM has the potential to scale nicely at even the most advanced technology nodes. However, patterning of small MTJ element leads to increasing variability in MTJ resistance and sustaining relatively high switching current or recording voltage variation in a STT-MRAM.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

Thus, it is desirable to provide STT-MRAM structures and methods that realize highly-accurate reading, highly-reliable recording and low power consumption while suppressing destruction and reduction of life of MTJ memory device due to recording in a nonvolatile memory that performs recording resistance changes, and maintaining a high thermal factor for a good data retention.

BRIEF SUMMARY OF THE PRESENT INVENTION

The present invention comprises a magnetoresistive element having an anisotropy modification layer and a voltage bias layer serving as a controlling gate of the anisotropy modification layer for a low power spin-transfer-torque MRAM. The magnetoresistive element in the invention has three terminals: an upper electrode, a middle electrode and a voltage bias layer as a bottom electrode wherein an MTJ stack and an anisotropy modification layer are sandwiched between an upper electrode and a voltage bias layer of each MRAM memory cell, which also comprises a write circuit which supplies a voltage drop or electric field on an anisotropy modification layer and bi-directionally supplies a spin polarized current to the magnetoresistive element, and a select transistor electrically connected between the magnetoresistive element and the write circuit.

The present invention comprises apparatus and a method provided for programming, recording and reading in a perpendicular STT-MRAM. A plurality of magnetoresistive memory element in a perpendicular STT-MRAM comprises: a recording layer having magnetic anisotropy in a direction perpendicular to a film surface and having a variable magnetization direction; a reference layer having magnetic anisotropy in a direction perpendicular to a film surface and having an invariable magnetization direction; a tunnel barrier layer provided between the recording layer and the reference layer; an anisotropy modification layer provided on a surface of the recording layer, which is opposite to a surface of the recording layer where the tunnel barrier layer is provided; a voltage bias layer provided on a surface of the anisotropy modification layer. A middle electrode is electrically connected to the recording layer. An upper electrode and a voltage bias layer sandwich a magnetoresistive memory element and a anisotropy modification layer, wherein a bit line coupled to the plurality of magnetoresistive memory elements through the upper electrode, a CMOS transistor coupled the plurality of magnetoresistive memory elements through the middle electrode and a digital line coupled to the anisotropy modification layer through the voltage bias layer.

The present invention comprises apparatus and a method provided for programming, recording and reading in a planar STT-MRAM. A plurality of magnetoresistive memory element in a planar STT-MRAM comprises: a recording layer having magnetic anisotropy in a film surface and having a variable magnetization direction; a reference layer having magnetic anisotropy in a film surface and having an invariable magnetization direction; a tunnel barrier layer provided between the recording layer and the reference layer; an anisotropy modification layer provided on a surface of the recording layer, which is opposite to a surface of the recording layer where the tunnel barrier layer is provided; a voltage bias layer provided on a surface of the anisotropy modification layer. A middle electrode is electrically connected to the recording layer. An upper electrode and a voltage bias layer sandwich a magnetoresistive memory element and a anisotropy modification layer, wherein a bit line coupled to the plurality of magnetoresistive memory elements through the upper electrode, a CMOS transistor coupled the plurality of magnetoresistive memory elements through the middle electrode and a digital line coupled to the anisotropy modification layer through the voltage bias layer.

An exemplary embodiment includes method of operating a spin-transfer-torque perpendicular magnetoresistive memory including a circuitry coupled to the bit line positioned adjacent to selected ones of the plurality of magnetoresistive memory elements and coupled to the digital line configured to apply an electric field on the anisotropy modification layer through the voltage bias layer and accordingly reduce the perpendicular anisotropy strength in the recording layer for a low write current during a recording process.

Another exemplary embodiment includes method of operating a spin-transfer-torque planar magnetoresistive memory including a circuitry coupled to the bit line positioned adjacent to selected ones of the plurality of magnetoresistive memory elements and coupled to the digital line configured to apply an electric field on the anisotropy modification layer through the voltage bias layer and accordingly enhance the perpendicular anisotropy strength in the recording layer for a low write current during a recording process.

Various embodiments will be described hereinafter with reference to the accompanying drawings. The drawings are schematic or conceptual, and the relationships between the thickness and width of portions, the proportional coefficients of sizes among portions, etc., are not necessarily the same as the actual values thereof.

DETAILED DESCRIPTION OF THE INVENTION

Figure 1:
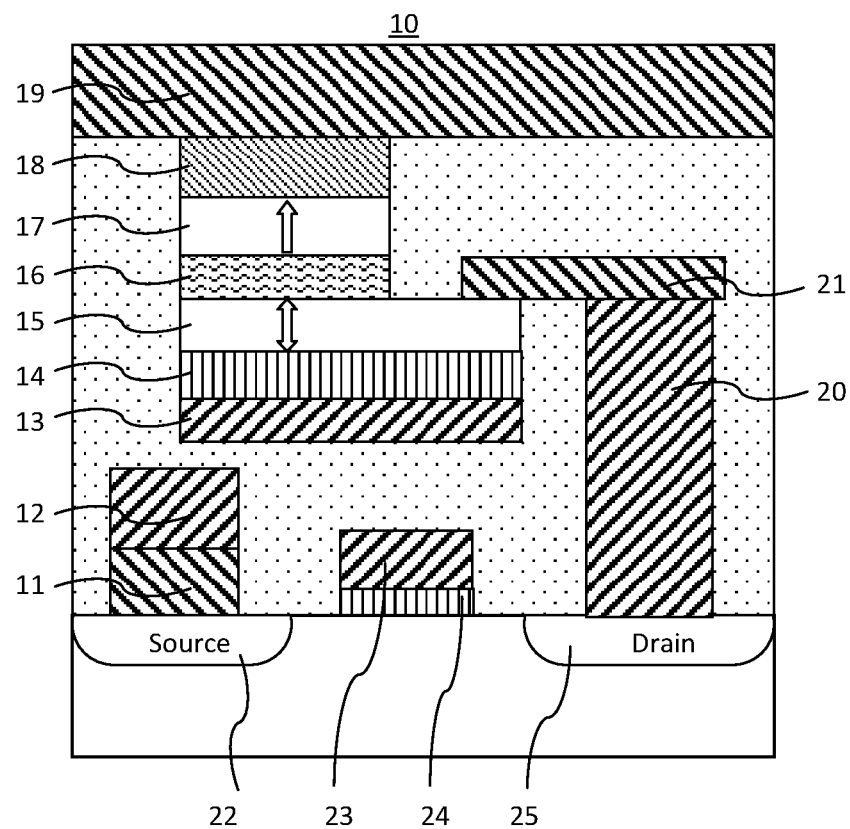
FIG. 1 is an exemplary cross-section of one memory cell in a perpendicular STT-MRAM array according to the first embodiment.

In general, according to each embodiment, there is provided a magnetoresistive element comprising:

a recording layer having magnetic anisotropy and having a variable magnetization direction;

a reference layer having magnetic anisotropy and having an invariable magnetization direction;

a tunnel barrier layer provided between the recording layer and the reference layer;

an anisotropy modification layer provided on a surface of the recording layer, which is opposite to a surface of the recording layer where the tunnel barrier layer is provided;

a voltage bias layer provided on a surface of the anisotropy modification layer serving as a first electrode;

a second electrode provided as the top electric connecting layer of the magnetoresistive element;

and middle electrode provided as the electric terminal directly connecting to the recording layer of the magnetoresistive element.

In each embodiment, there is also provided a magnetoresistive memory cell comprising a magnetoresistive element and further comprising:

a bit line coupled to the plurality of magnetoresistive memory elements through the second electrode;

a CMOS transistor coupled the plurality of magnetoresistive memory elements through the middle electrode.

and a digital line coupled to the anisotropy modification layer through the voltage bias layer.

An anisotropy modification layer is a dielectric layer made of a metal oxide (or nitride, chloride), like MgO, having a naturally stable rocksalt crystal structure having the (100) plane parallel to the substrate plane and with lattice parameter along its {110} direction being larger than the bcc (body-centered cubic)-phase Co lattice parameter along {100} direction. As an amorphous ferromagnetic material, like CoFeB, in the recording layer is thermally annealed, a crystallization process occurs to form bcc CoFe grains having epitaxial growth with (100) plane parallel to surface of the rocksalt crystal buffer layers.

In a rocksalt crystal structure of an anisotropy modification layer, such as MgO, two fcc sublattices for metal atom and O, each displaced with respect to the other by half lattice parameter along the [100] direction. However, at a surface, O atoms protrude while metal atoms retreat slightly from the surface, forming a strong interface interaction with the bcc CoFe grains. Accordingly, a perpendicular anisotropy is introduced or enhanced in the recording layer, as a result of the strong interface interaction between the recording layer and the anisotropy modification layer.

Further, as an electric field is applied on the anisotropy modification layer and perpendicular to the surface, the negative charged O atoms and positive charged metal atoms at surface are pulled toward opposite directions and modify the interface interaction between the bcc CoFe grains in the recording layer and the rocksalt crystal grains in the anisotropy modification layer. When an electric field points down towards the top surface of an anisotropy modification layer, O atoms protrude more from the surface and form a stronger interface interaction with the bcc CoFe grains, causing an enhanced perpendicular anisotropy, and vice versa. This mechanism is utilized hereafter to manipulate or modify the perpendicular anisotropy strength of the recording layer through applying a voltage bias on the dielectric anisotropy modification layer.

An exemplary embodiment includes method of operating a spin-transfer-torque perpendicular magnetoresistive memory including a circuitry coupled to the bit line positioned adjacent to selected ones of the plurality of magnetoresistive memory elements and coupled to the digital line configured to apply a positive voltage on the bias layer generating an electric field pointing away from the top surface of the anisotropy modification layer and accordingly reduce the perpendicular anisotropy strength in the recording layer for a low write current during a recording process.

Another exemplary embodiment includes method of operating a spin-transfer-torque planar magnetoresistive memory including a circuitry coupled to the bit line positioned adjacent to selected ones of the plurality of magnetoresistive memory elements and coupled to the digital line configured to apply a negative voltage on the bias layer generating an electric field pointing down into the top surface of the anisotropy modification layer and accordingly enhance the perpendicular anisotropy strength in the recording layer for a low write current during a recording process.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

First Embodiment

FIG. 1 is an exemplary cross-section of a magnetoresistive memory cell 10 in a perpendicular STT-MRAM array according to the first embodiment. The magnetoresistive memory cell 10 is configured by a bit line 19, an upper electrode 18, a reference layer 17, a tunnel barrier layer 16, a recording layer 15, an anisotropy modification layer 14, a voltage bias layer 13, and a select transistor comprising an interconnect layer 12, a source contact 11, drain contact 20, a middle electrode 21, source region 22, a gate insulating film 23, a gate electrode 24 and a drain region 25.

Figure 2A:
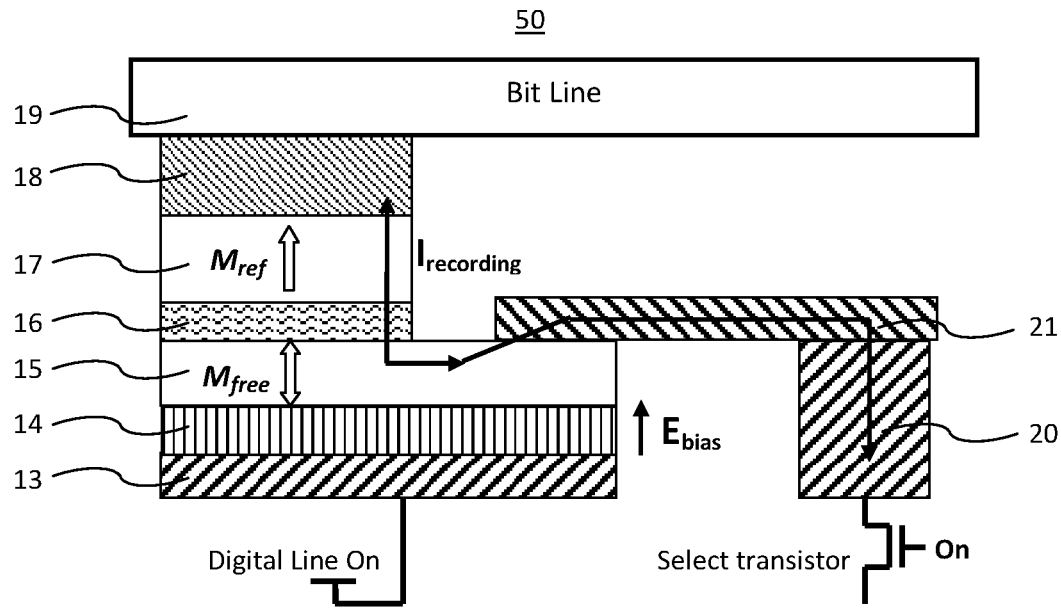
FIG. 2A illustrates a memory element, according to the first embodiment, having an upward electric field on the anisotropy modification layer by a positive bias voltage pulse through the digital line/bias layer to reduce the perpendicular anisotropy of the recording layer and reverse the magnetization to the direction in accordance with a direction of a recording spin-transfer current through the bit line into the MTJ stacked body along the stack direction.

FIG. 2A illustrates a magnetoresistive element 50 in a recording mode. A circuitry, which is not shown here, is coupled to the bit line for providing a bi-directional recording current between the upper electrode and the middle electrode connecting to the select transistor, and is coupled to the bias layer or digital line for providing a positive voltage on the bias layer in a recording mode. The magnetoresistive element 50 comprises: a bit line 19, an upper electrode 18, a reference layer 17, a tunnel barrier layer 16, a recording layer 15, an anisotropy modification layer 14, a voltage bias layer 13 as a bottom electrode, in the order from the top.

The recording layer 15 and reference layer 17 each are made of a ferromagnetic material, and have uni-axial magnetic anisotropy in a direction perpendicular to a film surfaces. Further, directions of easy magnetization of the recording layer 15 and reference layer 17 are also perpendicular to the film surfaces. The tunnel barrier layer 16 is made of a thin metal oxide, such as MgO, forming a thin tunneling junction magnetoresistance between the recording layer and the reference layer. In another word, the MTJ element 50 is a perpendicular MTJ element in which magnetization directions of the recording layer 15 and reference layer 17 face in directions perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists.

The recording layer 15 has a variable (reversible) magnetization direction. The reference layer 17 has an invariable (fixing) magnetization direction. The reference layer 17 is made of a ferromagnetic material having a perpendicular magnetic anisotropic energy which is sufficiently greater than the recording layer 15. This strong perpendicular magnetic anisotropy can be achieved by selecting a material, configuration and a film thickness. In this manner, a spin polarized current may only reverse the magnetization direction of the recording layer 15 while the magnetization direction of the reference layer 17 remains unchanged.

An example configuration of the MTJ element 50 will be described below. The reference layer 17 is made of TbCoFe (10 nm)/CoFeB(2 nm). The tunnel barrier layer 16 is made of MgO(1 nm). The recording layer 15 is made of CoFeB (1.4 nm). The anisotropy modification layer 14 is made of MgO(2 nm). The bias layer 13 is made of Ta(20 nm)/Cu(20 nm)/Ta(20 nm). Each element written in the left side of "/" is stacked above an element written in the right side thereof.

The anisotropy modification layer 14 serves to enhance or modify perpendicular magnetic anisotropy of the recording layer 15. The anisotropy modification layer 14 is preferred to be made of MgO layer, or other metal oxide (or nitride, chloride) layer which has a rocksalt crystalline as its naturally stable structure thereof will be described later.

The CoFeB (with B content no less than 15%) layer comprised in the recording layer 15 is formed into an amorphous state as deposited. The MgO layers comprised in the tunnel barrier layer 16 and the anisotropy modification layer are formed into rocksalt crystal grains with the (100) plane parallel to the substrate plane. In the rocksalt crystal structure, two fcc sublattices for Mg and O, each displaced with respect to the other by half lattice parameter along the [100] direction. Its lattice parameter along the {110} direction is ranged from 2.98 to 3.02 angstrom, which has slightly larger than bcc CoFe lattice parameter along {100} direction and has a lattice mismatch between 4% and 7%. After thermal annealing with a temperature higher than 250-degree, the amorphous CoFeB is crystallized to form bcc CoFe grains having epitaxial growth with (100) plane parallel to surface of the rocksalt crystal layers with in-plane expansion and out-of-plane contraction. Accordingly, a perpendicular magnetization is induced in the recording layer from both upper and lower interface interactions with the MgO layers. The fact that the tunnel barrier layer is made of a thin MgO layer maintaining a low magnetoresistance matched to the circuitry and the dielectric anisotropy modification layer is made of a thick MgO layer having a better rocksalt crystal structure interfacing with the bcc CoFe grains in the recording layer, the perpendicular anisotropy mainly comes from the lower interface interactions with the MgO anisotropy modification layer.

Since the MgO layer resistance increases exponentially with the thickness, a typical RA of an MTJ stack is preferred to be in the range of 3 to 20 ohm·μm$^2$, while the RA of an anisotropy modification layer can be made to be as high as 50K to 1 M ohm·μm$^2$, which makes the anisotropy modification layer a good dielectric layer and the amount of leakage current from a voltage bias layer to the MTJ stack is negligible. Applying a positive voltage on the bias layer generates an electric field pointing away from the top surface of the anisotropy modification layer and reduces the perpendicular anisotropy strength in the recording layer, accordingly, the magnetization of the recording layer is readily reversible, or switchable, to the direction in accordance with a direction of a much reduced recording current through the bit line into the stacked body along the stack direction to act on the recording layer. After recording, the bias voltage from a digital line/bias layer is switched off, and the perpendicular anisotropy is restored back in the recording layer maintaining a good thermal stability and data retention of the memory cell.

Figure 2B:
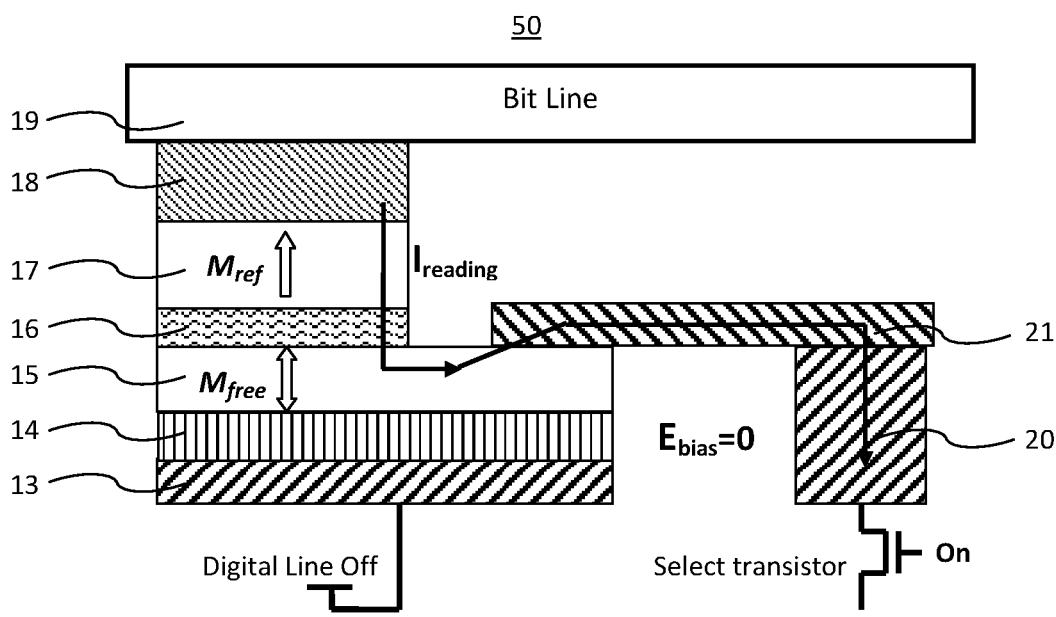
FIG. 2B illustrates a memory element, according to the first embodiment, having a strong perpendicular anisotropy of the recording layer is maintained with zero field on the anisotropy modification layer for read-out by a reading current through the bit line into the stacked body along the stack direction.

FIG. 2B illustrates a magnetoresistive element 50 in a read mode having a read current through the bit line into the stacked body along the stack direction while the bias voltage from a digital line is kept switched off. Once a negative voltage is applied to the digital line, an enhanced perpendicular anisotropy is obtained and the recording layer even becomes more stable against unintended spin-transfer switching during reading. As a result, the margins among reading voltage, recording voltage and break-down voltage is improved.

Figure 3:
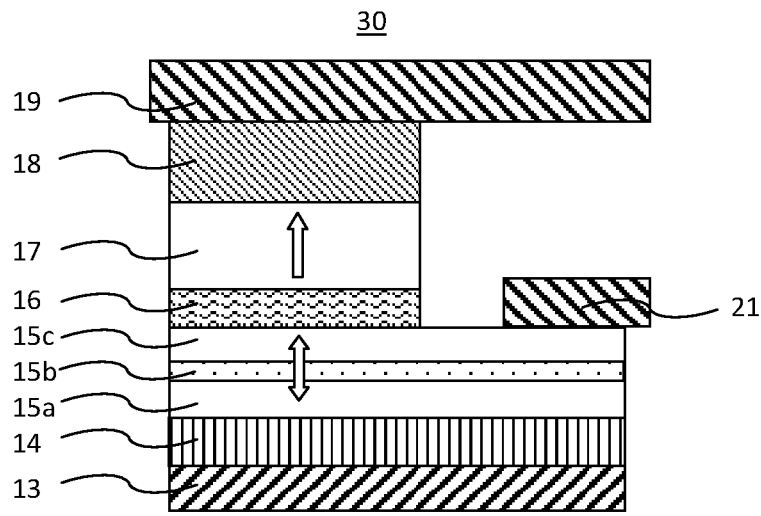
FIG. 3 is a cross-sectional view of one memory element according to a first modification of the first embodiment.

FIG. 3 is a cross-sectional view of a memory element according to a first modification of the first embodiment. The recording layer 15 has a multi-layer structure in which a first ferromagnetic layer 15a, a nonmagnetic insertion layer 15b, and a second ferromagnetic layer 15c are stacked in this order from the bottom, and rest layers are the same as shown in FIG. 1. An example configuration will be described below. The first ferromagnetic layer 15a is CoFeB(0.8 nm), the insertion layer 15b is Ta(0.3 nm), and the second magnetic layer 15c is CoFeB(0.6). From layer 15a to layer 15c, the Fe composition relative to Co is increased to improve MR ratio. Further, the perpendicular magnetic anisotropy can be improved by a thermal annealing process in which B atoms move toward the insertion Ta layer.

Figure 4:
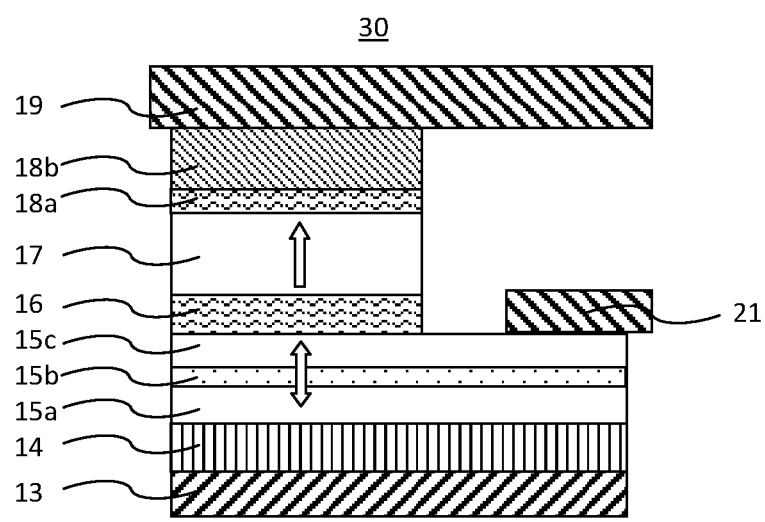
FIG. 4 is a cross-sectional view of one memory element according to a second modification of the first embodiment.

FIG. 4 is a cross-sectional view of a memory element according to a second modification of the first embodiment. The upper electrode 18 has a bi-layer structure having a first cap layer 18a made of a thin metal oxide (or nitride, chloride) with a rocksalt crystal structure and a second cap layer comprising metal or metal alloy layer. An example configuration will be described below. The first cap layer 18a is MgO(0.8 nm), the second cap layer 18b is Ru(2 nm)/PtMn(5 nm)/Ta(2 nm) and the reference layer 17 is CoFeB(1.2 nm).

Figure 5:
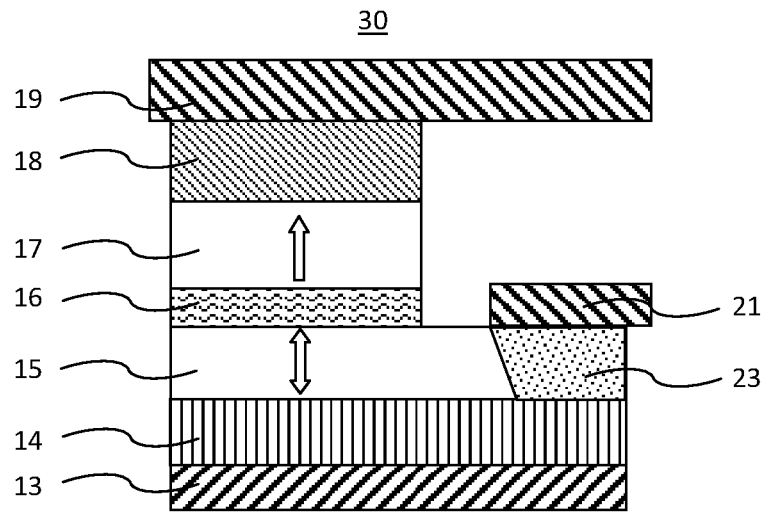
FIG. 5 is a cross-sectional view of one memory element according to a third modification of the first embodiment.

FIG. 5 is a cross-sectional view of a memory element according to a third modification of the first embodiment. A middle electrode-covered portion 23 of the recording layer is treated by an ion implantation process to eliminate the magnetization and obtain a better interface connection. Non-magnetic metal elements, such as Li, Cu, Al, are doped into these region.

Figure 6:
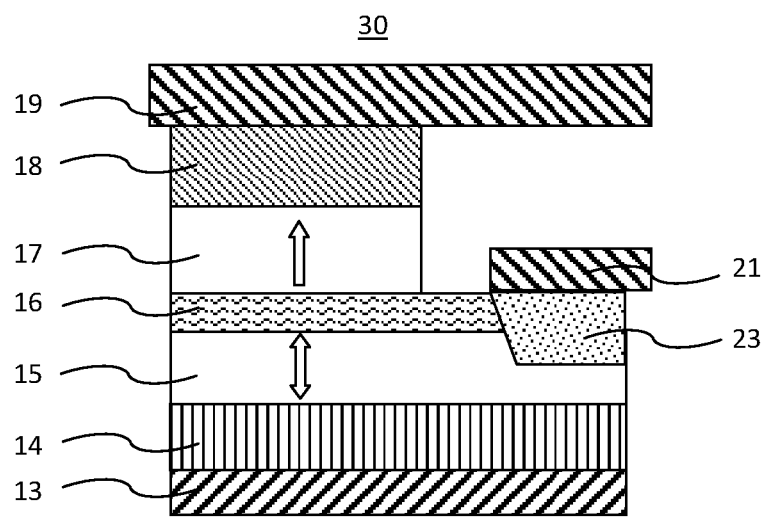
FIG. 6 is a cross-sectional view of one memory element according to a fourth modification of the first embodiment.

FIG. 6 is a cross-sectional view of a memory element according to a fourth modification of the first embodiment. A tunnel barrier layer is kept on top of a recording layer and a middle electrode-covered region 23 is treated by an ion implantation process to eliminate the magnetization and obtain a better interface connection. Non-magnetic metal elements, such as Li, Cu, Al, are doped into these region.

Second Embodiment

Figure 7:
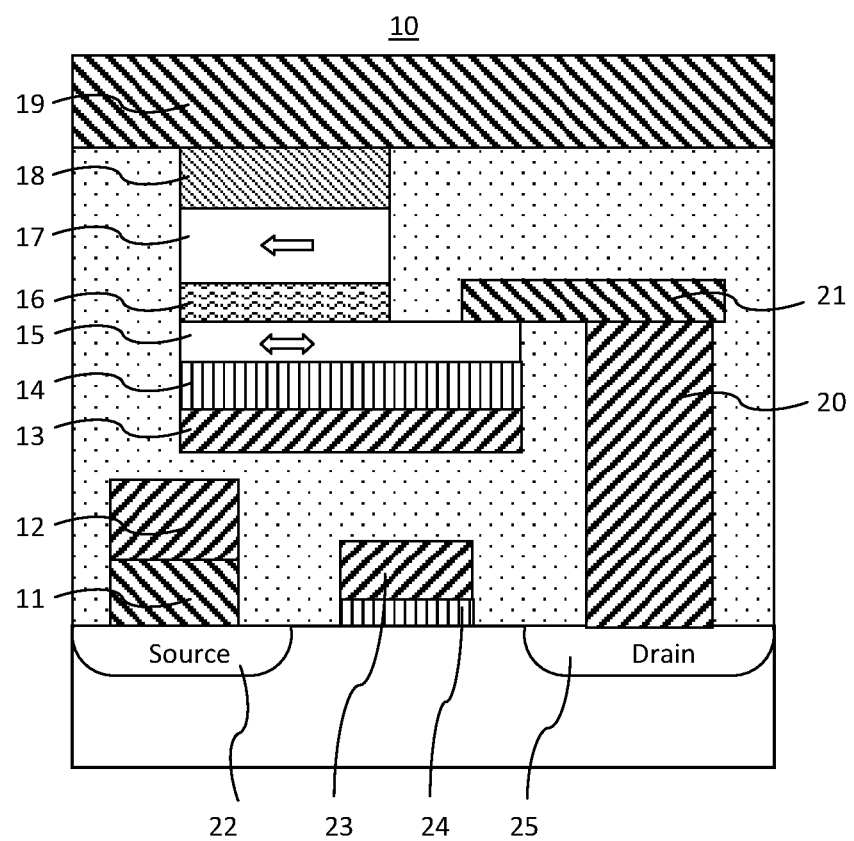
FIG. 7 is an exemplary cross-section of one memory cell in a planar STT-MRAM array according to the second embodiment.

FIG. 7 is an exemplary cross-section of a magnetoresistive memory cell 10 in a planar STT-MRAM array according to the second embodiment. The magnetoresistive memory cell 10 is configured by a bit line 19, an upper electrode 18, a reference layer stack 17, a tunnel barrier layer 16, a recording layer 15, an anisotropy modification layer 14, a voltage bias layer 13, and a select transistor comprising an interconnect layer 12, a source contact 11, a middle electrode 21, drain contact 20, a source region 22, a gate insulating film 23, a gate electrode 24 and a drain region 25.

Figure 8A:
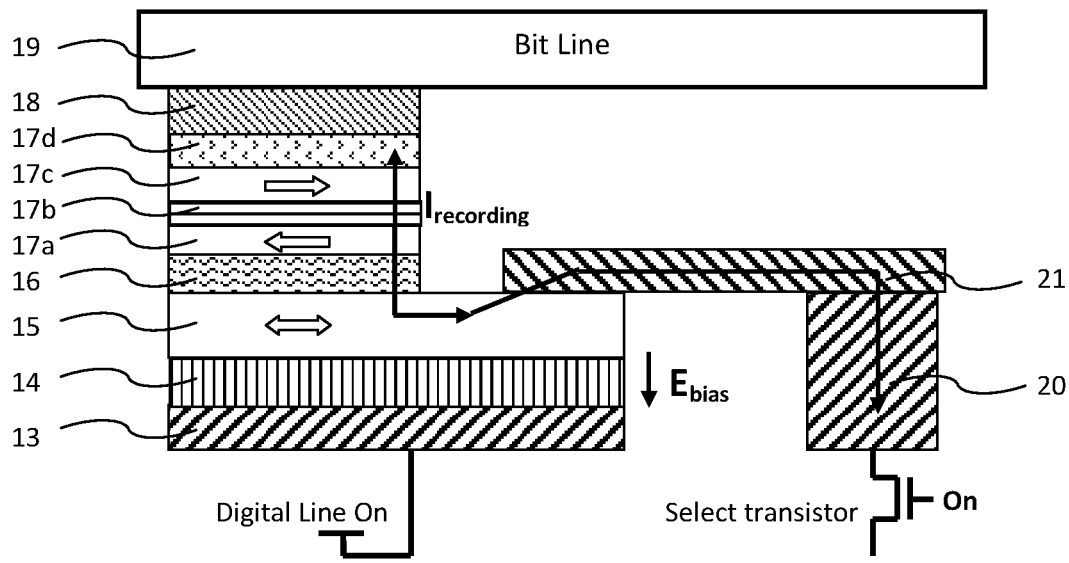
FIG. 8A illustrates a memory element, according to the second embodiment, having a downward electric field on the anisotropy modification layer by a positive bias voltage pulse through the digital line/bias layer to increase the perpendicular anisotropy of the recording layer and reverse the magnetization to the direction in accordance with a direction of a recording spin-transfer current through the bit line into the MTJ stacked body along the stack direction.

FIG. 8A illustrates a magnetoresistive element 50 in a recording mode. A circuitry, which is not shown here, is coupled to the bit line for providing a bi-directional recording current between the upper electrode and the middle electrode connecting to the select transistor, and is coupled to the bias layer or digital line for providing a negative voltage on the bias layer in a recording mode. The magnetoresistive element 50 comprises: a bit line 19, an upper electrode 18, an antiferromagnetic layer 17d, a pinned layer 17c, a anti-parallel coupling layer 17b, reference layer 17a, a tunnel barrier layer 16, a recording layer 15, an anisotropy modification layer 14, a voltage bias layer 13 as a bottom electrode, in the order from the top.

The pinned layer 17c is underneath and in contact with the antiferromagnetic ferromagnetic layer 17d. The ferromagnetic reference and pinned layers (17a, 17c) each have a magnetic moment vector that are usually held anti-parallel by the coupling spacer layer 17b and held in a fixed direction by the antiferromagnetic pinning layer. Thus the magnetic moment vector of fixed reference layer 17a is not free to rotate and is used as a reference. The coupling layer is typically one that exhibits the oscillatory coupling phenomenon, for example, at least one of the elements Ru, Os, Re, Cr, Rh, Cu, or their combinations, with a thickness chosen for strong anti-parallel coupling. The antiferromagnetic pinning layer, may comprise materials such as PtMn, IrMn, PdMn, or combinations thereof.

The recording layer 15 is made of a ferromagnetic material, and has uni-axial magnetic anisotropy in a film surfaces. The tunnel barrier layer 16 is made of a thin metal oxide, such as MgO, forming a thin tunneling junction magnetoresistance between the recording layer and the reference layer. A direction of easy magnetization is a direction in which the internal magnetic energy is at its minimum where no external magnetic field exists. Meanwhile, a direction of hard magnetization is a direction which the internal energy is at its maximum where no external magnetic field exists.

The recording layer 15 has a variable (reversible) magnetization direction. The reference layer 17 has an invariable (fixing) magnetization direction. In this manner, a spin polarized current may only reverse the magnetization direction of the recording layer 15 while the magnetization direction of the reference layer 17 remains unchanged.

An example configuration of the MTJ element 50 will be described below. The reference layer 17 stack is made of PtMn(20 m)/CoFe(2 nm)/Ru(0.8 nm)/CoFe(2 nm). The tunnel barrier layer 16 is made of MgO(1 nm). The recording layer 15 is made of CoFeB(3 nm). The anisotropy modification layer 14 is made of MgO(2 nm). The bias layer 13 is made of Ta(20 nm)/Cu(20 nm)/Ta(20 nm). Each element written in the left side of "/" is stacked above an element written in the right side thereof.

The anisotropy modification layer 14 serves to enhance or modify perpendicular magnetic anisotropy of the recording layer 15. The anisotropy modification layer 14 is preferred to be made of MgO layer, or other metal oxide (or nitride, chloride) layer which has a rocksalt crystalline as its naturally stable structure.

The CoFeB (with B content no less than 15%) layer comprised in the recording layer 15 is formed into an amorphous state as deposited. The MgO layers comprised in the tunnel barrier layer 16 and the anisotropy modification layer are formed into rocksalt crystal grains with the (100) plane parallel to the substrate plane. In the rocksalt crystal structure, two fcc sublattices for Mg and O, each displaced with respect to the other by half lattice parameter along the [100] direction. Its lattice parameter along the {110} direction is ranged from 2.98 to 3.02 angstrom, which has slightly larger than bcc CoFe lattice parameter along {100} direction and has a lattice mismatch between 4% and 7%. After thermal annealing with a temperature higher than 250-degree, the amorphous CoFeB is crystallized to form bcc CoFe grains having epitaxial growth with (100) plane parallel to surface of the rocksalt crystal layers with in-plane expansion and out-of-plane contraction. Accordingly, a perpendicular anisotropy is induced in the recording layer from both upper and lower interface interactions with the MgO layers. The fact that the tunnel barrier layer is made of a thin MgO layer maintaining a low magnetoresistance matched to the circuitry and the dielectric anisotropy modification layer is made of a thick MgO layer having a better rocksalt crystal structure interfacing with the bcc CoFe grains in the recording layer, the perpendicular anisotropy mainly comes from the lower interface interactions with the MgO anisotropy modification layer. Since the perpendicular anisotropy comes from the interface interaction, the magnetization of a thick CoFeB recording layer still lies in a film plane. A critical spin-transfer current is reduced as a perpendicular anisotropy increases.

Since the MgO layer resistance increases exponentially with the thickness, a typical RA of an MTJ stack is preferred to be in the range of 3 to 20 ohm·μm$^2$, while the RA of an anisotropy modification layer can be made to be as high as 0.1 to 1 M ohm·μm$^2$, which makes the anisotropy modification layer a good dielectric layer and the amount of leakage current from a voltage bias layer to the MTJ stack is negligible. Applying a negative voltage on the bias layer generates an electric field pointing towards the top surface of the anisotropy modification layer and increases the perpendicular anisotropy strength in the recording layer, accordingly, the magnetization of the recording layer is readily reversible, or switchable, to the direction in accordance with a direction of a much reduced recording current through the bit line into the stacked body along the stack direction to act on the recording layer. After recording, the bias voltage from a digital line/bias layer is switched off, and the perpendicular anisotropy comes back to its original value in the recording layer maintaining a good thermal stability and data retention of the memory cell.

Figure 8B:
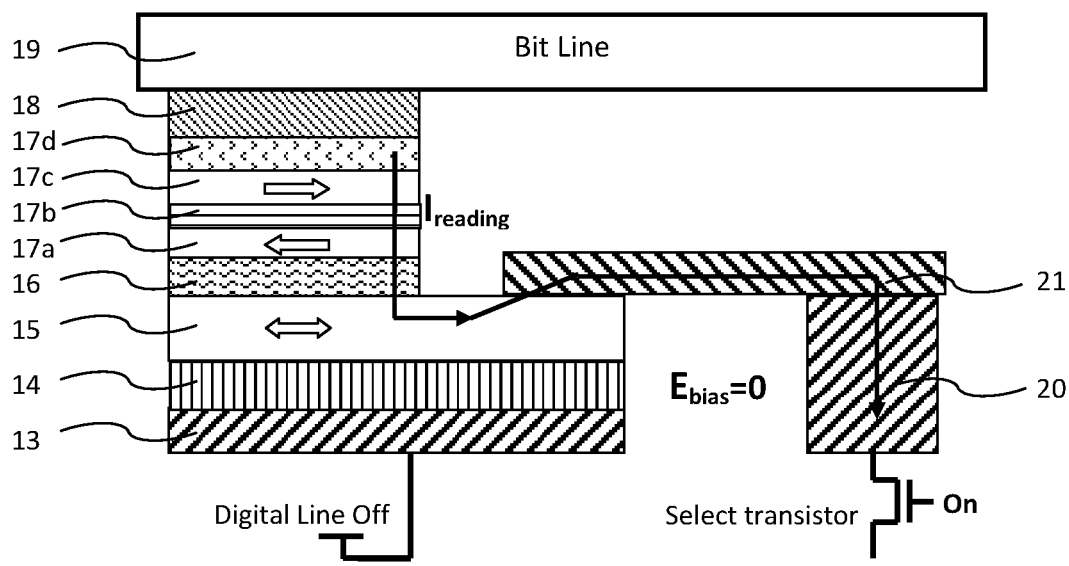
FIG. 8B illustrates a memory element, according to the second embodiment, having a strong perpendicular anisotropy of the recording layer is maintained with zero field on the anisotropy modification layer for read-out by a reading current through the bit line into the stacked body along the stack direction.

FIG. 8B illustrates a magnetoresistive element 50 in a read mode having a read current through the bit line into the stacked body along the stack direction while the bias voltage from a digital line is kept switched off. Once a positive voltage is applied to the digital line, a reduced perpendicular anisotropy is obtained and the recording layer becomes more stable against unintended spin-transfer switching during reading.

Figure 9:
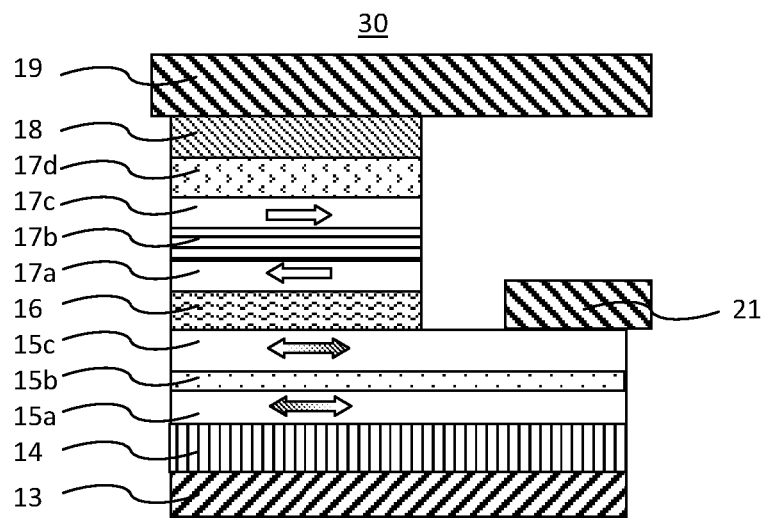
FIG. 9 is a cross-sectional view of one memory element according to a first modification of the second embodiment.

FIG. 9 is a cross-sectional view of a memory element 30 according to a first modification of the second embodiment. The recording layer 15 has a multi-layer structure in which a first ferromagnetic layer 15a, a nonmagnetic insertion layer 15b, and a second ferromagnetic layer 15c are stacked in this order from the bottom, and rest layers are the same as shown in FIG. 7. An example configuration will be described below. The first ferromagnetic layer 15a is CoFeB (1.8 nm), the insertion layer 15b is Ta(0.3 nm), and the second magnetic layer 15c is CoFe(0.6). From layer 15a to layer 15c, the Fe composition relative to Co is increased to improve MR ratio. Further, the perpendicular magnetic anisotropy can be improved by a thermal annealing process in which B atoms move toward the insertion Ta layer.

Figure 10:
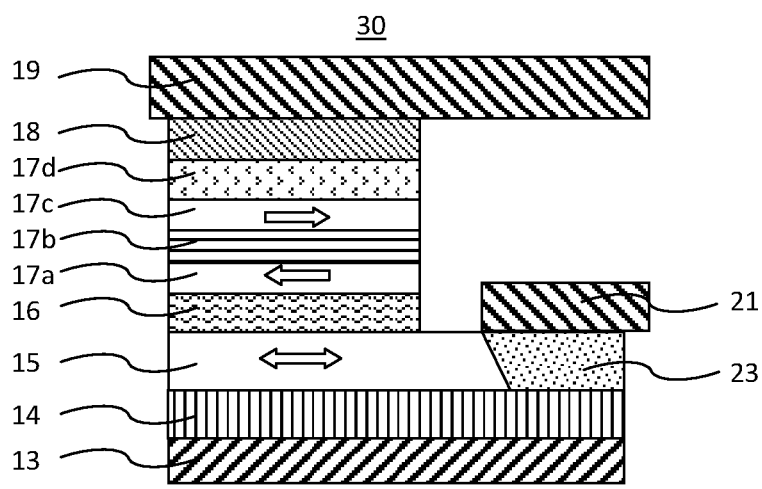
FIG. 10 is a cross-sectional view of one memory element according to a second modification of the second embodiment.

FIG. 10 is a cross-sectional view of a memory element according to a second modification of the second embodiment. A middle electrode-covered portion 23 of the recording layer is treated by an ion implantation process to eliminate the magnetization and obtain a better interface connection. Non-magnetic metal elements, such as Li, Cu, Al, are doped into these region.

Figure 11:
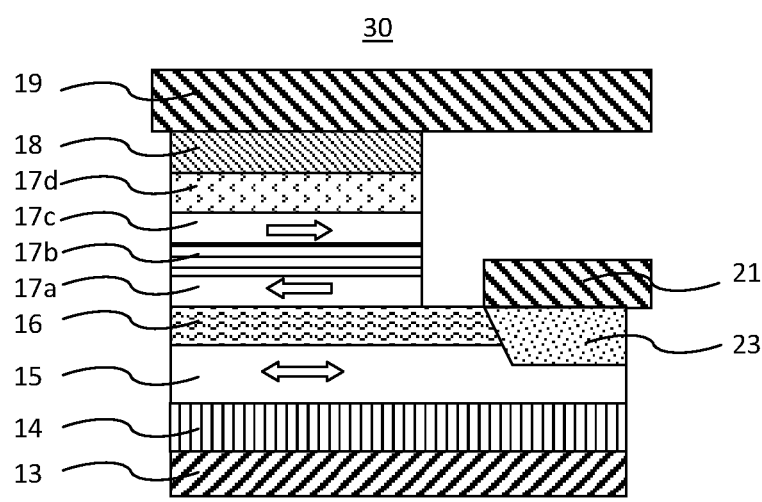
FIG. 11 is a cross-sectional view of one memory element according to a third modification of the second embodiment.

FIG. 11 is a cross-sectional view of a memory element according to a third modification of the second embodiment. A tunnel barrier layer is kept on top of a recording layer and a middle electrode-covered region 23 is treated by an ion implantation process to eliminate the magnetization and obtain a better interface connection. Non-magnetic metal elements, such as Li, Cu, Al, are doped into these region.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spin-transfer torque magnetoresistive memory element comprises at least one memory cell (10, 50) comprising a magnetoresistive memory element, a bit line (19), a digital line (13), a select transistor, and a control circuitry,
   wherein the magnetoresistive memory element further comprises:
      a recording layer (15) having a magnetic anisotropy and having a variable magnetization direction;
      a reference layer (17) having a magnetic anisotropy and having an invariable magnetization direction;
      a tunnel barrier layer (16) provided between the recording layer (15) and the reference layer (17);
      a dielectric anisotropy modification layer (14) provided on a surface of the recording layer (15), which is opposite to a surface of the recording layer (15) where the tunnel barrier layer (16) is provided, having a sufficient thickness capable of functioning as an insulating layer to prevent leakage current from a voltage bias layer (13) to the recording layer (15);
      the voltage bias layer (13) provided on a surface of the dielectric anisotropy modification layer (14), which is opposite to a surface of the dielectric anisotropy modification layer (14) where the recording layer (15) is provided, wherein the voltage bias layer (13) is electrically connected to the digital line of the spin-transfer torque magnetoresistive memory;
      an upper electrode (18) provided on a surface of the reference layer (17), which is opposite to a surface of the reference layer (17) where the tunnel barrier layer (16) is provided, wherein the upper electrode (18) is electrically connected to the bit line of the spin-transfer torque magnetoresistive memory;
      a middle electrode (21) provided as an electric connecting terminal of the recording layer (15) of the magnetoresistive element, wherein the middle electrode (21) is electrically connected to a drain/source terminal of the select transistor of the spin-transfer torque magnetoresistive memory;
      and wherein the control circuitry is coupled through the bit line (19), the digital line and the select transistor to selected ones of a plurality of magnetoresistive memory elements, configured to provide a bi-directional spin-transfer recording current between the upper electrode and the middle electrode and to provide a bias voltage between the digital line and the middle electrode to generate an electric field through the dielectric anisotropy modification layer wherein an electric field potential direction is perpendicular to a surface of the recording layer for modifying a perpendicular anisotropy in the recording layer (15) in a recording operation, and configured to provide a reading current between the bit line (19) and the select transistor in a reading operation.

2. The element of claim 1, wherein said dielectric anisotropy modification layer (14) comprises a metal oxide, nitride, or chloride having a stable rocksalt crystal structure with a (100) plane parallel to the recording layer.

3. The element of claim 1, wherein said dielectric anisotropy modification layer (14) comprises a single layer of oxide, or nitride, or chloride having a rocksalt crystal structure and containing at least one element selected from Na, Li, Mg, Ca, Zn, Cd, In, Sn, Cu, Ag.

4. The element of claim 1, wherein said dielectric anisotropy modification layer (14) has a thickness between 1.5 nm and 10 nm.

5. The element of claim 1, wherein said dielectric anisotropy modification layer (14) has an RA (resistance-area product) of more than 1000 ohms per square micron.

6. The element of claim 1, wherein said voltage bias layer (13) comprises a conductive layer or multilayer made of a metal or ahoy having a thickness more than 10 nm and less than 5000 nm.

7. The element of claim 1, wherein the magnetoresistive memory element comprises an intermediate layer between the voltage bias layer (13) and the dielectric anisotropy modification layer (14), having an amorphous or nanocrystal structure, comprising a Boron ahoy layer containing at least one element from Co, Fe, Ni and having a thickness between 0.3 nm and 3 nm.

8. The element of claim 1, wherein said tunnel barrier layer (16) comprises MgO, ZnO, MgZnO, MgN, or MgON.

9. The element of claim 1, wherein said dielectric anisotropy modification layer (14) has a perpendicular resistance value in a read/write current flow direction at least 5 times as that of an MTJ junction formed by the reference layer (15), tunnel barrier layer (16), and the recording layer (17).

10. The element of claim 1, wherein said recording layer (15) comprises a layer of Boron ahoy with Co, Fe, Ni.

11. The element of claim 1, wherein said recording layer (15) comprises a layer of CoFeB or CoB, having a Boron composition percentage of 10% or larger.

12. The element of claim 1, wherein said recording layer (15) comprises a multi-layer comprising a first Co-alloy layer (15c), immediately adjacent to said tunnel barrier layer, a second Co alloy layer (15a), and an insertion layer (15b) provided between the first Co-alloy layer (15c) and the second Co-alloy layer (15a) and containing at least one element selected from Ta, Hf, Zr, Ti, Mg, Nb, W, Mn, Ru, Al, Cu, Si and having a thickness less than 0.5 nm.

13. The element of claim 1, wherein said magnetoresistive memory element is a perpendicular magnetoresistive memory element, said recording layer (15) has a magnetic anisotropy and a variable magnetization in a direction perpendicular to a film surface, said reference layer (17) has a magnetic anisotropy and a invariable magnetization in a direction perpendicular to a film surface, and said bias voltage is a positive voltage in the recording operation and a negative voltage in the reading operation.

14. The element of claim 13, wherein said positive voltage is in a range from 0.5 to 1.8 volt.

15. The element of claim 13, wherein said negative voltage is in a range between 0 and −1.8 volt.

* * * * *